United States Patent
Yoo et al.

(10) Patent No.: US 11,910,584 B2
(45) Date of Patent: Feb. 20, 2024

(54) COMPOSITE MATERIAL

(71) Applicant: LG CHEM, LTD., Seoul (KR)

(72) Inventors: Dong Woo Yoo, Daejeon (KR); Yeon Soo Lee, Daejeon (KR); Jin Kyu Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 455 days.

(21) Appl. No.: 17/262,370

(22) PCT Filed: Sep. 27, 2019

(86) PCT No.: PCT/KR2019/012545
§ 371 (c)(1),
(2) Date: Jan. 22, 2021

(87) PCT Pub. No.: WO2020/067743
PCT Pub. Date: Apr. 2, 2020

(65) Prior Publication Data
US 2021/0289677 A1    Sep. 16, 2021

(30) Foreign Application Priority Data

Sep. 28, 2018 (KR) .......... 10-2018-0116435
Sep. 28, 2018 (KR) .......... 10-2018-0116436

(51) Int. Cl.
*H05K 9/00* (2006.01)
*B32B 5/18* (2006.01)
(Continued)

(52) U.S. Cl.
CPC ............. *H05K 9/0088* (2013.01); *B32B 5/18* (2013.01); *B32B 5/32* (2013.01); *B32B 7/12* (2013.01);
(Continued)

(58) Field of Classification Search
CPC .................................................. H05K 9/0088
See application file for complete search history.

(56) References Cited

U.S. PATENT DOCUMENTS

| 7,632,565 B1 | 12/2009 | Imam et al. |
| 2015/0027771 A1* | 1/2015 | Kagawa .......... H01Q 17/00 174/350 |

(Continued)

FOREIGN PATENT DOCUMENTS

| CN | 100577715 C | 1/2010 |
| CN | 106922112 A | 7/2017 |

(Continued)

OTHER PUBLICATIONS

International Search Report corresponding to PCT/KR2019/012545; dated Feb. 13, 2020 (6 pages, including English translation).

(Continued)

*Primary Examiner* — Hung V Ngo
(74) *Attorney, Agent, or Firm* — Saliwanchik, Lloyd & Eisenschenk

(57) ABSTRACT

The present application relates to a composite material. The present application can provide a composite material having high magnetic permeability and also having excellent mechanical properties such as flexibility. The composite material may be used in various applications, and for example, may be used as an electromagnetic-wave shielding material and the like.

11 Claims, 2 Drawing Sheets

(51) Int. Cl.
    *B32B 5/32*     (2006.01)
    *B32B 7/12*     (2006.01)
    *B32B 15/04*     (2006.01)
    *B32B 15/08*     (2006.01)
    *H01F 1/147*     (2006.01)
    *B22F 3/11*     (2006.01)

(52) U.S. Cl.
    CPC ............ *B32B 15/046* (2013.01); *B32B 15/08* (2013.01); *H01F 1/14708* (2013.01); *B22F 3/1125* (2013.01); *B32B 2307/202* (2013.01); *B32B 2307/208* (2013.01); *B32B 2307/212* (2013.01)

(56) References Cited

U.S. PATENT DOCUMENTS

| | | |
|---|---|---|
| 2015/0366107 A1 | 12/2015 | Hansen et al. |
| 2017/0210090 A1 | 7/2017 | Kim et al. |
| 2017/0244271 A1 | 8/2017 | Kim et al. |
| 2019/0141867 A1* | 5/2019 | Chien .................. H05K 9/0088 |
| 2019/0387651 A1* | 12/2019 | Rauscher .................. B32B 7/03 |

FOREIGN PATENT DOCUMENTS

| | | |
|---|---|---|
| CN | 108394148 A | 8/2018 |
| JP | H0987707 A | 3/1997 |
| JP | 2002198684 A | 7/2002 |
| JP | 2007027354 A | 2/2007 |
| JP | 2010090416 A | 4/2010 |
| JP | 2013045926 A | 3/2013 |
| JP | 2013084701 A | 5/2013 |
| JP | 2017017223 A | 1/2017 |
| JP | 2017532216 A | 11/2017 |
| JP | 2018156981 A | 10/2018 |
| KR | 20050113937 A | 12/2005 |
| KR | 20160124273 A | 10/2016 |
| KR | 20170113413 A | 10/2017 |
| KR | 20170113414 A | 10/2017 |
| KR | 20180062170 A | 6/2018 |
| KR | 20180062171 A | 6/2018 |
| KR | 20180062172 A | 6/2018 |

OTHER PUBLICATIONS

Extended European Search Report corresponding to EP 19867161.2; dated Oct. 21, 2021 (12 pages).
1 European Office Action corresponding to EP Application No. 19867161.2; dated Sep. 8, 2023 (12 pages).

\* cited by examiner

FIG. 1

| 10 |
|---|
| 20 |

FIG. 2

| 30 |
|---|
| 10 |
| 20 |

FIG. 3

| 10 |
|---|
| 20 |
| 30 |

FIG. 4

| 30 |
|---|
| 10 |
| 20 |
| 30 |

FIG. 5

| 10 |
|---|
| 30 |
| 20 |

FIG. 6

| 10 |
|---|
| 20 |
| 30 |
| 10 |
| 20 |
| 30 |
| 10 |
| 20 |
| 30 |

COMPOSITE MATERIAL

CROSS-REFERENCE TO RELATED APPLICATIONS

This application is a 35 U.S.C. § 371 national stage application of PCT International Application No. PCT/KR2019/012545, filed Sep. 27, 2019, which claims priority based on Korean Patent Application Nos. 10-2018-0116436 and 10-2018-0116435 filed on Sep. 28, 2018, the disclosures of which are incorporated herein by reference in their entirety. The above-referenced PCT International Application was published in the Korean language as International Publication No. WO 2020/067743 on Apr. 2, 2020.

TECHNICAL FIELD

The present application relates to a composite material.

BACKGROUND ART

Materials having high magnetic permeability can be used for various applications. For example, such a material can be used in various devices or materials including an EMC core, a low-power high-inductance resonance circuit or a broadband transformer, and the like, and can also be used as a wave absorber.

Typically, a material in the form of a polymer composite material film prepared by rolling a metal having high magnetic permeability or using metal particles as a filler is used as the material having high magnetic permeability.

However, in the method such as rolling, there are problems that the process is complicated and the price is high, because a multicomponent material is used or the crystallization is performed on the film, in order to increase the magnetic permeability of the metal material.

In addition, when the metal particles are used as the filler, the amount of the metal particles should be increased in order to secure high magnetic permeability, and in this case, the film is less flexible, where there may also be a problem in the electrically insulating part.

DISCLOSURE

Technical Problem

The present application relates to a composite material. It is one object of the present application to provide a composite material having high magnetic permeability and also having excellent mechanical properties such as flexibility. The composite material may be used in various applications, which may be, for example, used as an electromagnetic-wave shielding material and the like.

Technical Solution

The present application is for composite materials. The composite material of the present application may comprise a first region formed of a metal foam having a conductive metal component and a second region formed of a metal foam having a soft magnetic metal component.

The composite material of the present application in such a form exhibits high magnetic permeability, and is formed of a metal foam, thereby also having excellent mechanical properties such as flexibility.

The composite material may be formed of a material having high magnetic permeability due to the unique surface area and pore characteristics of the metal foam and multiple reflection and absorption by the material of the metal foam, where the application of the metal foam can secure excellent mechanical strength and flexibility to the material.

In this specification, the term metal foam or metal skeleton means a porous structure comprising a metal as a main component. Here, the fact that the metal is used as a main component means a case where the ratio of the metal is 55 weight % or more, 60 weight % or more, 65 weight % or more, 70 weight % or more, 75 weight % or more, 80 weight % or more, 85 weight % or more, 90 weight % or more, or 95 weight % or more based on the total weight of the metal foam or the metal skeleton. The upper limit of the ratio of the metal contained as the main component is not particularly limited, which may be, for example, 100 weight %, 99 weight %, or 98 weight % or so.

In this specification, the term porousness may mean a case where it has a porosity of at least 10% or more, 20% or more, 30% or more, 40% or more, 50% or more, 60% or more, 70% or more, 75% or more, or 80% or more. The upper limit of the porosity is not particularly limited, which may be, for example, less than about 100%, about 99% or less, about 98% or less, about 95% or less, about 90% or less, about 85% or less, 80% or less, or about 75% or less or so. The porosity can be calculated in a known manner by calculating the density of the metal foam or the like.

Among physical properties mentioned in this specification, when the measured temperature affects the relevant physical property, the physical property is measured at room temperature, unless otherwise specified. The term room temperature is a natural temperature without warming or cooling, which may mean, for example, a temperature in a range of about 10° C. to about 30° C., or a temperature of about 23° C. or about 25° C. or so.

The form of the metal foam included in the composite material is not particularly limited, but in one example, it may be a film or sheet shape.

For example, the first region and the second region are each a metal foam layer, where the metal foam layer of the first region and the metal foam layer of the second region may be laminated on each other. FIG. 1 is a schematic diagram of the above structure, which shows a case where the metal foam layer (10) of the first region and the metal foam layer (20) of the second region are laminated on each other.

The metal foam in the composite material may have the following pore characteristics. The pore characteristics to be described below may be in the range of the entire composite material in which the metal foams of the first region and the second region are integrated, or in the range of the metal foam of any one of the first and second regions, and in one example, the metal foam of the first region and the metal foam of the second region may have the same or different pore characteristics.

The metal foam in the composite material may have a porosity of about 10% or more. The metal foam having this porosity has a porous metal framework forming a suitable network, and thus it can ensure high magnetic permeability even if a small amount of the relevant metal foam is applied. In another example, the porosity may be 15% or more, 20% or more, 25% or more, 30% or more, 35% or more, 40% or more, 45% or more, 50% or more, 55% or more, 60% or more, 65% or more, or 70% or more, or may be 99% or less, 98% or less, about 95% or less, about 90% or less, 85% or less, about 80% or less, or about 75% or less or so.

The pore characteristics of the metal foam can be further controlled to ensure proper magnetic permeability and the like. For example, the metal foam may include approximately spherical, needle or random shape pores. For example, the metal foam may have a maximum pore size of about 100 μm or less, about 90 μm or less, about 80 μm or less, about 70 μm or less, about 60 μm or less, about 50 μm or less, 45 μm or less, 40 μm or less, 35 μm or less, or 30 μm or less or so. In another example, the maximum pore size may be about 2 μm or more, 4 μm or more, 6 μm or more, 8 μm or more, 10 μm or more, 12 μm or more, 14 μm or more, 16 μm or more, 18 μm or more, 20 μm or more, 22 μm or more, 24 μm or more, or 26 μm or more.

85% or more pores of the whole pores of the metal foam may have a pore size of 10 μm or less and 65% or more pores may have a pore size of 5 μm or less. Here, the lower limit of the pore size of the pores having a pore size of 10 μm or less or 5 μm or less is not particularly limited, but in one example, the pore size may be more than about 0 μm, 0.1 μm or more, 0.2 μm or more, 0.3 μm or more, 0.4 μm or more, 0.5 μm or more, 0.6 μm or more, 0.7 μm or more, 0.8 μm or more, 0.9 μm or more, 1 μm or more, 1.1 μm or more, 1.2 μm or more, 1.3 μm or more, 1.4 μm or more, 1.5 μm or more, 1.6 μm or more, 1.7 μm or more, 1.8 μm or more, 1.9 μm or more, or 2 μm or more.

Here, the pores having a pore size of 10 μm or less of the whole pores may be 100% or less, 95% or less, or 90% or less or so, and the ratio of the pores having a pore size of 5 μm or less may be 100% or less, 95% or less, 90% or less, 85% or less, 80% or less, 75% or less, or 70% or less or so.

The desired composite material can be produced by this pore distribution or characteristic. For example, when the composite material or metal foam is in the form of a film, sheet or layer, the pore distribution may be determined based on the major axis direction of the film, sheet or layer.

As mentioned above, the metal foam may be in the form of a film, sheet or layer. In this case, the thickness of the film, sheet or layer may be adjusted in consideration of properties such as the desired magnetic permeability.

For example, the total thickness of the metal foam layer of the first region and the metal foam layer of the second region may be in a range of about 10 μm to 2,000 μm. In another example, the total thickness may be 20 μm or more, 30 μm or more, 40 μm or more, 50 μm or more, 60 μm or more, 70 μm or more, 80 μm or more, 90 μm or more, or 100 μm or more, or may also be 1,900 μm or less, 1,800 μm or less, 1,700 μm or less, 1,600 μm or less, 1,500 μm or less, 1,400 μm or less, 1,300 μm or less, 1,200 μm or less, 1,100 μm or less, 1,000 μm or less, 900 μm or less, 800 μm or less, 700 μm or less, 600 μm or less, 500 μm or less, 400 μm or less, 300 μm or less, 200 μm or less, or about 180 μm or less or so.

Also, here, the ratio (T2/T1) of the thickness (T1) of the metal foam layer of the first region and the thickness (T2) of the metal foam layer of the second region may be in a range of 0.2 to 10. In another example, the ratio (T2/T1) may be about 0.3 or more, 0.35 or more, or 0.4 or more, or may also be 9 or less, 8 or less, 7 or less, 6 or less, 5 or less, 4 or less, or 3.5 or less or so.

In this specification, when the thickness of the relevant target is not constant, the thickness may be a minimum thickness, a maximum thickness or an average thickness of the target.

Through the thickness control as above, it may be possible to provide a composite material of the desired properties.

The metal foam forming the first region of the metal foams may be a metal foam of a conductive metal component. The term conductive metal component may mean a conductive metal or metal alloy. In the present application, the term conductive metal or metal alloy may mean a metal or metal alloy having a conductivity at 20° C. of about 8 MS/m or more, 9 MS/m or more, 10 MS/m or more, 11 MS/m or more, 12 MS/m or more, 13 MS/m or more, or 14.5 MS/m or more. The upper limit of the conductivity is not particularly limited, which may be, for example, about 30 MS/m or less, 25 MS/m or less, or 20 MS/m or less.

The metal foam of the conductive metal component may mean a metal foam made of only the conductive metal component or containing the metal component as the main component. Therefore, the metal foam may comprise 55 weight % or more, 60 weight % or more, 65 weight % or more, 70 weight % or more, 75 weight % or more, 80 weight % or more, 85 weight % or more, 90 weight % or more, or 95 weight % or more of the conductive metal component based on the total weight. The upper limit of the ratio of the conductive metal component is not particularly limited, which may be, for example, 100 weight %, 99 weight % or 98 weight % or so.

An example of the applicable specific conductive metal components can be exemplified by nickel, iron, cobalt, silver, copper, gold, aluminum, calcium, tungsten, zinc, lithium, iron, platinum, tin, lead, titanium, manganese, magnesium or chromium, and the like, an alloy of two or more of the forgoing, and the like, but is not limited thereto. However, in the present application, various materials known to have soft magnetism may be applied in addition to the material.

The metal foam of the first region as above may be designed to exhibit a shielding efficiency of 80 dB or more within a range of 50 kHz to 3 GHz alone, which may be achieved by forming a metal foam using the material so as to have the above-described pore characteristics.

The metal foam of the second region may be a metal foam of a soft magnetic metal component. The term soft magnetic metal component is a soft magnetic metal or metal alloy, where the definition of soft magnetism is as known in the industry. Here, the metal foam of a soft magnetic metal component may be composed of only a soft magnetic metal component or may mean a metal foam containing the metal component as a main component. Accordingly, the metal foam may comprise the soft magnetic metal component in an amount of 55 weight % or more, 60 weight % or more, 65 weight % or more, 70 weight % or more, 75 weight % or more, 80 weight % or more, 85 weight % or more, 90 weight % or more, or 95 weight % or more based on the total weight. The upper limit of the ratio of the soft magnetic metal component is not particularly limited, which may be, for example, 100 weight %, 99 weight % or 98 weight % or so.

An example of specific soft magnetic metal components can be exemplified by an Fe/Ni alloy, an Fe/Ni/Mo alloy, an Fe/Al/Si alloy, an Fe/Si/B alloy, an Fe/Si/Nb alloy, an Fe/Si/Cu alloy or an Fe/Si/B/Nb/Cu alloy, and the like, but is not limited thereto. Here, Fe means iron, Ni means nickel, Mo means molybdenum, Al means aluminum, Si means silicon, B means boron, Nb means niobium, and Cu means copper. However, in the present application, various materials known to have soft magnetism may be applied in addition to the material.

Various methods for producing metal foams are known. In the present application, the metal foams of the first and/or second regions as described above may be produced in such a known manner and applied. At this time, the composite material may also be formed by integrally forming the metal foam of the first region and the metal foam of the second region, or separately producing them and then attaching them to each other. In this case, the attachment can be performed with a pressure-sensitive adhesive layer or an adhesive layer. Therefore, here, when the metal foam layer of the first region and the metal foam layer of the second region are laminated, the pressure-sensitive adhesive layer or the adhesive layer may be present therebetween.

As a method for preparing a metal foam, a method of sintering a pore-forming agent such as a salt and a composite material of a metal, a method of coating a metal on a support such as a polymer foam and sintering it in this state or a slurry method, and the like is known. Furthermore, the metal foam can also be produced by a method disclosed in Korean Patent Application No. 2017-0086014, 2017-0040971, 2017-0040972, 2016-0162154, 2016-0162153 or 2016-0162152, and the like, which is a prior application of the present applicant.

In one example, the method for producing a composite material of the present application may comprise steps of sintering a metal foam precursor including the soft magnetic metal component to form the second region and sintering a metal foam precursor including the conductive metal component to form the first region. The steps may be performed simultaneously or sequentially, and when they are performed sequentially, the order is not limited. In the present application, the term metal foam precursor means a structure before the process which is performed to form a metal foam, such as the sintering, that is, a structure before the metal foam is generated. In addition, even if the metal foam precursor is referred to as a porous metal foam precursor, it is not necessarily porous by itself, and it can be referred to as a porous metal foam precursor for convenience, as long as it can finally form a metal foam, which is a porous metal structure.

In one example of the present application, the metal foam precursor may be formed using a slurry including at least a metal component, a dispersant and/or a binder. That is, the slurry may comprise the metal component and the dispersant, comprise the metal component and the binder, or comprise the metal component, the dispersant and the binder.

Here, as the metal component, a metal powder can be applied. An example of the applicable metal powder is determined depending on the purpose, which is not particularly limited, and a powder of a metal or a powder of a metal alloy or a powder of a metal mixture, which is capable of forming the above-described conductive or soft magnetic metal component, can be applied.

The size of the metal powder is also selected in consideration of the desired porosity or pore size, and the like, which is not particularly limited, but for example, the metal powder may have an average particle diameter in a range of about 0.1 µm to about 200 µm. In another example, the average particle diameter may be about 0.5 µm or more, about 1 µm or more, about 2 µm or more, about 3 µm or more, about 4 µm or more, about 5 µm or more, about 6 µm or more, about 7 µm or more, or about 8 µm or more. In another example, the average particle diameter may be about 150 µm or less, 100 µm or less, 90 µm or less, 80 µm or less, 70 µm or less, 60 µm or less, 50 µm or less, 40 µm or less, 30 µm or less, 20 µm or less, 15 µm or less, or 10 µm or less. As the metal in the metal particles, those having different average particle diameters may also be applied. The average particle diameter can be appropriately selected in consideration of the shape of the desired metal foam, for example, the thickness or the porosity of the metal foam.

The average particle diameter of the metal powder can be obtained by a known particle size analysis method, and for example, the average particle diameter may be a so-called D50 particle diameter.

The ratio of the metal component (metal powder) in the slurry is not particularly limited, which can be selected in consideration of the desired viscosity, process efficiency, and the like. In one example, the ratio of the metal component in the slurry may be 0.5 to 95% or so based on weight, but is not limited thereto. In another example, the ratio may be about 1% or more, about 1.5% or more, about 2% or more, about 2.5% or more, about 3% or more, about 5% or more, 10% or more, 15% or more, 20% or more, 25% or more, 30% or more, 35% or more, 40% or more, 45% or more, 50% or more, 55% or more, 60% or more, 65% or more, 70% or more, 75% or more, or 80% or more, or may be about 90% or less, about 85% or less, about 80% or less, about 75% or less, about 70% or less, about 65% or less, 60% or less, 55% or less, 50% or less, 45% or less, 40% or less, 35% or less, 30% or less, 25% or less, 20% or less, 15% or less, 10% or less, or 5% or less or so.

For example, the ratio of the metal component (metal powder) in the slurry forming the metal foam forming the first region may be about 0.5 to 95% or so on the basis of weight, but is not limited thereto. In another example, the ratio may be about 1% or more, about 1.5% or more, about 2% or more, about 2.5% or more, about 3% or more, about 5% or more, 10% or more, 15% or more, 20% or more, 25% or more, 30% or more, 35% or more, 40% or more, 45% or more, 50% or more, 55% or more, 60% or more, 65% or more, 70% or more, 75% or more, or 80% or more, or may be about 90% or less, about 85% or less or so, but is not limited thereto.

For example, the ratio of the metal component (metal powder) in the slurry forming the metal foam forming the second region may be about 0.5 to 95% or so on the basis of weight, but is not limited thereto. In another example, the ratio may be about 1% or more, about 1.5% or more, about 2% or more, about 2.5% or more, about 3% or more, about 5% or more, 10% or more, 15% or more, 20% or more, 25% or more, 30% or more, 35% or more, 40% or more, 45% or more, 50% or more, or 55% or more, or may be about 90% or less, about 85% or less, about 80% or less, about 75% or less, about 70% or less, or about 65% or less, but is not limited thereto.

In one example, the ratio of the metal component (metal powder) in the slurry forming the metal foam of the first region and the ratio of the metal component (metal powder) in the slurry forming the metal foam of the second region may be different from each other.

The metal foam precursor may be formed using a slurry comprising a dispersant and/or a binder together with the metal powder.

Here, as the dispersant, for example, an alcohol may be applied. As the alcohol, a monohydric alcohol with 1 to 20 carbon atoms such as methanol, ethanol, propanol, pentanol, octanol, ethylene glycol, propylene glycol, pentanol, 2-methoxyethanol, 2-ethoxyethanol, 2-butoxyethanol, glycerol, texanol or terpineol, or a dihydric alcohol with 1 to 20 carbon atoms such as ethylene glycol, propylene glycol, hexanediol, octanediol or pentanediol, or a higher polyhydric alcohol, and the like may be used, but the kind is not limited to the above.

The slurry may comprise a binder. The kind of such a binder is not particularly limited, which may be appropriately selected depending on the kind of the metal component and/or dispersant applied upon producing the slurry. For example, the binder can be exemplified by an alkylcellulose having an alkyl group with 1 to 8 carbon atoms such as methylcellulose or ethylcellulose, a polyalkylene carbonate having an alkylene unit with 1 to 8 carbon atoms such as polypropylene carbonate or polyethylene carbonate, or a polyvinyl alcohol-based binder (hereinafter, may be referred to as a polyvinyl alcohol compound) such as polyvinyl alcohol or polyvinyl acetate, and the like, but is not limited thereto.

The ratio of each component in such a slurry is not particularly limited. Such a ratio can be adjusted in consideration of the process efficiency such as coating property and moldability at the time of performing the process using the slurry.

For example, the binder may be contained in the slurry at a ratio of about 1 to 500 parts by weight relative to 100 parts by weight of the above-described metal component. In another example, the ratio may be about 2 parts by weight or more, about 3 parts by weight or more, about 4 parts by weight or more, about 5 parts by weight or more, about 6 parts by weight or more, about 7 parts by weight or more, about 8 parts by weight or more, about 9 parts by weight or more, about 10 parts by weight or more, about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 110 parts by weight or more, about 120 parts by weight or more, about 130 parts by weight or more, about 140 parts by weight or more, about 150 parts by weight or more, about 200 parts by weight or more, or about 250 parts by weight or more, and may be about 450 parts by weight or less, about 400 parts by weight or less, about 350 parts by weight or less, about 300 parts by weight or less, about 250 parts by weight or less, about 200 parts by weight or less, about 150 parts by weight or less, about 100 parts by weight or less, about 50 parts by weight or less, about 40 parts by weight or less, about 30 parts by weight or less, about 20 parts by weight or less, or about 10 parts by weight or less.

For example, in the slurry forming the metal foam of the first region, the binder may be included in a ratio of about 1 to 500 parts by weight relative to 100 parts by weight of the aforementioned metal component. In another example, the ratio may be about 2 parts by weight or more, about 3 parts by weight or more, about 4 parts by weight or more, about 5 parts by weight or more, about 6 parts by weight or more, about 7 parts by weight or more, about 8 parts by weight or more, or about 9 parts by weight or more, and may be about 450 parts by weight or less, about 400 parts by weight or less, about 350 parts by weight or less, about 300 parts by weight or less, about 250 parts by weight or less, about 200 parts by weight or less, about 150 parts by weight or less, about 100 parts by weight or less, about 50 parts by weight or less, about 40 parts by weight or less, about 30 parts by weight or less, about 20 parts by weight or less, about 15 parts by weight or less, or about 10 parts by weight or less.

For example, in the slurry forming the metal foam of the second region, the binder may be included in a ratio of about 1 to 500 parts by weight relative to 100 parts by weight of the aforementioned metal component. In another example, the ratio may be about 2 parts by weight or more, about 3 parts by weight or more, about 4 parts by weight or more, about 5 parts by weight or more, about 6 parts by weight or more, about 7 parts by weight or more, about 8 parts by weight or more, about 9 parts by weight or more, about 10 parts by weight or more, about 20 parts by weight or more, about 30 parts by weight or more, about 40 parts by weight or more, about 50 parts by weight or more, about 60 parts by weight or more, or 65 parts by weight or more, and may be about 450 parts by weight or less, about 400 parts by weight or less, about 350 parts by weight or less, about 300 parts by weight or less, about 250 parts by weight or less, about 200 parts by weight or less, about 150 parts by weight or less, about 100 parts by weight or less, about 90 parts by weight or less, about 80 parts by weight or less or about 75 parts by weight or less, or about 70 parts by weight or less.

In one example, the ratio of the binder in the slurry forming the metal foam of the first region and the ratio of the binder in the slurry forming the metal foam of the second region may be different from each other.

The dispersant may be included in the slurry at a ratio of about 10 to 2,000 parts by weight relative to 100 parts by weight of the binder. In another example, the ratio may be about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 200 parts by weight or more, about 300 parts by weight or more, about 400 parts by weight or more, about 500 parts by weight or more, about 550 parts by weight or more, about 600 parts by weight or more, or about 650 parts by weight or more, and may be about 1,800 parts by weight or less, about 1,600 parts by weight or less, about 1,400 parts by weight or less, about 1,200 parts by weight or less, about 1,000 parts by weight or less, 900 parts by weight or less or so, 800 parts by weight or less or so, 700 parts by weight or less or so, 600 parts by weight or less or so, 500 parts by weight or less or so, 400 parts by weight or less or so, 300 parts by weight or less or so, 200 parts by weight or less or so, 100 parts by weight or less or so, or 90 parts by weight or less or so.

Unless otherwise specified, the unit weight part herein means a weight ratio between the respective components.

The slurry may further comprise a solvent, if necessary. However, according to one example of the present application, the slurry may not comprise the solvent. As the solvent, a suitable solvent may be used in consideration of solubility of the components of the slurry, for example, the metal component or the binder, and the like. For example, as the solvent, one having a dielectric constant in a range of about 10 to 120 can be used. In another example, the dielectric constant may be about 20 or more, about 30 or more, about 40 or more, about 50 or more, about 60 or more, or about 70 or more, or may be about 110 or less, about 100 or less, or about 90 or less. Such a solvent can be exemplified by water or an alcohol with 1 to 8 carbon atoms such as ethanol, butanol or methanol, DMSO (dimethyl sulfoxide), DMF (dimethylformamide) or NMP (N-methylpyrrolidinone), and the like, but is not limited thereto.

When a solvent is applied, it may be present in the slurry at a ratio of about 50 to 400 parts by weight relative to 100 parts by weight of the binder, but is not limited thereto. In another example, the ratio of the solvent may be about 60 parts by weight or more, about 70 parts by weight or more, about 80 parts by weight or more, about 90 parts by weight or more, about 100 parts by weight or more, about 110 parts by weight or more, about 120 parts by weight or more, about 130 parts by weight or more, about 140 parts by weight or more, about 150 parts by weight or more, about 160 parts by weight or more, about 170 parts by weight or more, about 180 parts by weight or more, or about 190 parts by weight or more, or may be about 350 parts by weight or less, 300 parts by weight or less, or 250 parts by weight or less, but is not limited thereto.

The slurry may also further comprise necessary known additives in addition to the above-mentioned components. However, the process of the present application may be performed using a slurry that does not include a foaming agent in known additives.

In another example of the present application, the metal foam precursor may also be formed using a slurry including at least a metal component, an aqueous solvent, an organic solvent and a surfactant.

Specific details of the metal components in this type of slurry are as described above.

The slurry may comprise an aqueous solvent, an organic solvent and a surfactant together with the metal component. By adjusting the ratio and type of the aqueous solvent, the organic solvent and the surfactant in the slurry, a microemulsion is formed in the metal foam precursor, where such an emulsion can determine the pore characteristics of the metal foam. If necessary, the metal foam precursor may also be subjected to a foaming process. For example, due to the difference in vapor pressure between the organic solvent and the aqueous solvent, a component having a larger vapor pressure may be vaporized in the foaming process to control the pore characteristics of the metal foam.

Here, as the aqueous solvent, water or other polar solvents may be applied, and water may be typically applied. Such an aqueous solvent may be included in a ratio of 50 to 200 parts by weight relative to 100 parts by weight of the metal powder in the slurry. In another example, the ratio of the aqueous solvent may be 70 to 100 parts by weight.

Here, as the organic solvent, an appropriate kind may be selected without particular limitation. As such an organic solvent, for example, a hydrocarbon-based organic solvent may be applied. As the hydrocarbon-based organic solvent, an organic solvent having 4 to 12 carbon atoms may be applied, and as a specific example thereof, n-pentane, neopentane, hexane, isohexane, heptane, isoheptane, octane, toluene, benzene, pentyne, hexyne, pentene, hexene, heptene, octene, cyclopentane, cycloheptane, cyclooctane, cyclopentene, cyclohexene, cycloheptene, cyclooctene or cyclopentanone, and the like may be applied. Such an organic solvent may be included in a ratio of 0.1 to 3 parts by weight relative to 100 parts by weight of the metal powder in the slurry.

The type of surfactant applied to the slurry is not particularly limited, and for example, any one selected from the group consisting of known amphoteric surfactants, nonionic surfactants and anionic surfactants, or a mixture of two or more of the foregoing may be applied. Among the surfactants as above, an appropriate kind for forming a desired microemulsion may be selected, and types of aqueous solvents and organic solvents applied in this process may be considered.

As is known, the anionic surfactant is a surfactant in which a part showing interfacial activity is an anion, and as the anionic surfactant, for example, a carboxylate compound, a sulfate compound, an isethionate compound, a sulfosuccinate compound, a taurate compound and/or a glutamate compound may be applied, without being limited thereto.

As is known, the nonionic surfactant is a surfactant which is not separated into ions, and as such a surfactant, for example, an alkyl polyglucoside-based surfactant, a fatty acid alkanolamide-based surfactant, or surfactants in the form that ethylene oxide is added to amine oxide series and higher alcohols and ethylene oxide is added to oil, and the like may be used.

The amphoteric surfactant is a surfactant having an anionic site and a cationic site at the same time, and as such a surfactant, betaines, such as cocamidopropyl betaine, or lauramidopropyl betaine, cocobetaine or lauryl betaine, or sultaines, such as laurylhydroxysultaine, lauramidopropylsultaine, cocamidopropylhydroxysultaine or cocosultaine, and the like may be applied, without being limited thereto.

As the surfactant, any one of the above-mentioned anionic, nonionic or amphoteric surfactants may be used alone, or two or more surfactants may be mixed and used.

The surfactant may be included in a ratio of 1 to 10 parts by weight relative to 100 parts by weight of the metal powder in the slurry.

The slurry may further comprise necessary components in addition to the above components. For example, the slurry may further comprise a binder. As the binder, for example, a binder applied in the slurry of the first type as described above may be applied, without particular limitation. The binder may be included in a ratio of 2 to 20 parts by weight relative to 100 parts by weight of the metal powder in the slurry. In another example, the ratio may also be 4 to 10 parts by weight.

In order to impart plasticity to a metal foam or its precursor, the slurry may further comprise a plasticizer. As the plasticizer, an appropriate kind that can impart plasticity to the above-described slurry system or metal foam may be selected, and for example, a polyhydric alcohol, fat and oil, an ether compound or an ester compound, and the like may be applied, without being limited thereto.

When the plasticizer is included, the ratio in the slurry is not particularly limited, which may be controlled at an appropriate ratio in consideration of the desired plasticity.

The slurry may also comprise known additives which are additionally required in addition to the components as mentioned above.

The method of forming the metal foam precursor using such a slurry is not particularly limited. In the field of manufacturing metal foams, various methods for forming metal foam precursors are known, and in the present application, all these methods can be applied. For example, the metal foam precursor can be formed by maintaining the slurry in a suitable template, or by coating the slurry in an appropriate manner.

When a metal foam is produced in the form of a film or sheet according to one example of the present application, it may be advantageous to apply a coating process. For example, after the slurry is coated on a suitable base material to form a precursor, the desired metal foam may be formed through a sintering process to be described below.

If necessary, an appropriate drying and/or foaming process may also be performed in the process of forming the metal foam precursor. In this case, the conditions of the drying and/or foaming process are not particularly limited, which may be controlled to form a desired level of metal foam precursor.

In addition, the sintering process may also be performed under appropriate conditions without particular limitation. For example, the sintering can be performed by maintaining the precursor at a temperature in the range of about 500° C. to 2000° C., 700° C. to 1500° C., or 800° C. to 1200° C., and the holding time may also be selected arbitrarily. In one example, the holding time may be in a range of about 1 minute to 10 hours or so, but is not limited thereto.

Through such a sintering process, the desired composite material can be formed. For example, after the slurry forming the metal foam of the first region and the slurry forming the metal foam of the second region are coated sequentially to form a metal foam precursor integrally, the composite material may also be produced through the sintering, and after the metal foams of the first and second regions are produced, respectively, the desired composite materials may also be obtained by laminating them using a pressure-sensitive adhesive or an adhesive.

In one example, the composite material may comprise a conductive material-containing layer as an additional configuration. Here, the conductive material-containing layer is a layer containing a conductive material. The conductive material-containing layer may be present on the metal foam layer of the first or second region.

Such a conductive material-containing layer may be particularly useful in forming a composite material structure by combining a plurality of the composite materials of the present application.

That is, if necessary, a plurality of single composite materials may be combined in the application process of the composite material, where the magnetic permeability may be reduced in the vicinity of the interface between the composite materials, or the shielding performance may be reduced when applied as an electromagnetic-wave shielding material. Furthermore, in addition to the case of combining a plurality of composite materials, the same phenomenon may also occur at the interface between the metal foam layer of the first region and the metal foam layer of the second region. By applying the conductive material-containing layer, the above problems can be solved.

The conductive material-containing layer may be present on the metal foam layer of the first or second region, and may be present, for example, in the forms as shown in FIGS. 2 to 5. In FIGS. 2 to 6, 10 represents the metal foam layer of the first region, 20 represents the metal foam layer of the second region, and 30 represents the conductive material-containing layer.

That is, the conductive material-containing layer may be on the side opposite to the surface of the metal foam layer of the first region facing the metal foam layer of the second region (FIG. 2), the side opposite to the surface of the metal foam layer of the second region facing the metal foam layer of the first region (FIG. 3), the side opposite to the surface of the metal foam layer of the first region facing the metal foam layer of the second region and the side opposite to the surface of the metal foam layer of the second region facing the metal foam layer of the first region (FIG. 4), or between the metal foam layer of the first region and the metal foam layer of the second region (FIG. 5).

Particularly, in the case of the forms shown in FIGS. 2 to 4, they may be useful when combining a plurality of composite materials in the form as in FIG. 6.

In another example, in the composite material, the metal foam layer of the first region and the metal foam layer of the second region may be laminated in a staggered state on each other, and the conductive material-containing layer may be formed on the surface which does not overlap with the metal foam layer of the second region among the surface of the metal foam layer of the first region facing the metal foam layer of the second region or the surface which does not overlap with the metal foam layer of the first region among the surface of the metal foam layer of the second region facing the metal foam layer of the first region.

Here, the fact that the metal foam layer of the first region and the metal foam layer of the second region are laminated in a staggered state may mean, for example, as shown in FIG. 7 or 8, a case where the two metal foam layers are disposed to face each other, but at least one metal foam layer of the two metal foam layers is laminated to have a portion which does not overlap with another metal foam layer. Here, the overlapping is based on when the composite material is observed from the top or the bottom along the normal direction of the composite material.

As shown in FIG. 7 or 8, the conductive material-containing layer (30) may be formed on the surface which does not overlap with the metal foam layer (20) of the second region among the surface of the metal foam layer (10) of the first region facing the metal foam layer (20) of the second region or the surface which does not overlap with the metal foam layer (10) of the first region among the surface of the metal foam layer (20) of the second region facing the metal foam layer of the first region.

This structure is useful when combining composite materials as in FIG. 9.

The kind of the conductive material included in the conductive material-containing layer is not particularly limited as long as it is selected to exhibit an appropriate conductivity. For example, as the conductive material, a material having a conductivity at 20° C. of about 8 MS/m or more, 9 MS/m or more, 10 MS/m or more, 11 MS/m or more, 12 MS/m or more, 13 MS/m or more or 14.5 MS/m or more can be used. The upper limit of the conductivity is not particularly limited, which may be, for example, about 30 MS/m or less, 25 MS/m or less, or 20 MS/m or less.

As the conductive material, for example, a material in the form of particles may be used. If the conductive material in the form of particles is used, the average particle diameter of the particles may be in a range of about 5 μm to 500 μm. In another example, the average particle diameter may be about 7 μm or more, or about 9 μm or more. In another example, the average particle diameter may be about 450 μm or less, about 400 μm or less, about 350 μm or less, about 300 μm or less, about 250 μm or less, about 200 μm or less, about 150 μm or less, 100 μm or less, 90 μm or less, 80 μm or less, 70 μm or less, 60 μm or less, 50 μm or less, 40 μm or less, 30 μm or less, or 20 μm or less.

Specifically, the conductive material may be exemplified by a metal such as nickel, iron, cobalt, silver, copper, gold, aluminum, calcium, tungsten, zinc, lithium, iron, platinum, tin, lead, titanium, manganese, magnesium or chromium or an alloy of two or more of the foregoing, or a material such as graphite, carbon black, carbon fiber, carbon nanotube or graphene, but is not limited thereto.

Although the specific form of the conductive material-containing layer is not particularly limited, it may be appropriate to form the conductive material-containing layer as the pressure-sensitive adhesive layer or the adhesive layer in consideration of the combination possibility between composite materials as described above.

The specific kind of the applicable pressure-sensitive adhesive or adhesive layer is not particularly limited, and for example, the conductive material may be introduced into a known adhesive or pressure-sensitive adhesive including an acrylic resin, an epoxy resin, a silicone resin, a urethane resin, or the like as a base resin to form the layer. The conductive material-containing layer can be formed by applying or transferring such a pressure-sensitive adhesive or adhesive layer to a desired site.

Although the ratio of the conductive material in the layer is not particularly limited, for example, the conductive material may be introduced in a ratio of 30 to 200 parts by weight relative to 100 parts by weight of the base resin. In another example, the ratio may be about 40 parts by weight or more, about 50 parts by weight or more, about 60 parts by weight or more, about 70 parts by weight or more, about 80 parts by weight or more, or about 90 parts by weight or more, or may be about 180 parts by weight or less, about 160 parts by weight or less, about 140 parts by weight or less, about 120 parts by weight or less, or about 110 parts by weight or less or so.

The present application also relates to a composite material structure. The term composite material structure may refer to an object in which at least two single composite materials are combined, as shown in FIG. 6 or 9. At this time, as shown in FIG. 6 or 9, the composite materials may be combined via the conductive material-containing layer in the composite material.

In addition, as shown in FIG. 9, the composite material structure may have a structure that the metal foam layer of the first region and the metal foam layer of the second region in the single composite material are laminated in a staggered state on each other, the conductive material-containing layer in the single composite material is formed on the surface which does not overlap with the metal foam layer of the second region among the surface of the metal foam layer of the first region facing the metal foam layer of the second region or the surface which does not overlap with the metal foam layer of the first region among the surface of the metal foam layer of the second region facing the metal foam layer of the first region, and the plurality of composite materials are combined so that the metal foam layer of the first region in one composite material and the metal foam layer of the second region in the other composite material are overlapped via the conductive material-containing layer.

Here, when the conductive material-containing layer is a pressure-sensitive adhesive layer or an adhesive layer, the combination may mean a case where the composite material is attached via the pressure-sensitive adhesive layer or the adhesive layer, as described above.

Advantageous Effects

The present application can provide a composite material having high magnetic permeability and also having excellent mechanical properties such as flexibility. The composite material may be used in various applications, and for example, may be used as an electromagnetic-wave shielding material and the like.

BRIEF DESCRIPTION OF DRAWINGS

FIGS. 1 to 5, 7 and 8 are schematic diagrams of exemplary forms of composite materials of the present application.

FIGS. 6 and 9 are diagrams showing exemplary forms of composite material structures.

MODE FOR INVENTION

Figure 7:
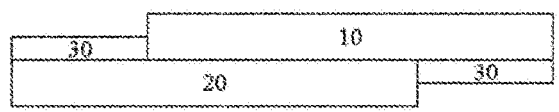
Figure 8:
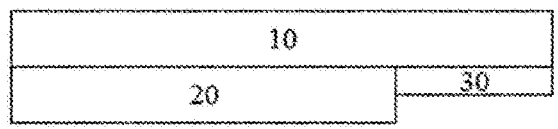
Figure 9:
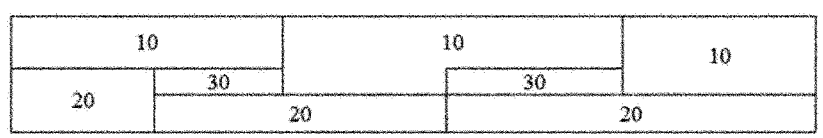

Hereinafter, the present application will be described in detail by way of examples and comparative examples, but the scope of the present application is not limited to the following examples.

Example 1

Production of Metal Foam of First Region

Copper (Cu) powder with an average particle diameter (D50 particle diameter) of less than about 10 μm was used as a metal component.

A slurry was prepared by mixing the copper powder with a mixture, in which ethylene glycol (EG) as a dispersant and ethyl cellulose (EC) as a binder were mixed in a weight ratio (EG:EC) of 4:5, such that the binder and the copper powder had a weight ratio (Cu:EC) of about 10:1. The slurry was coated in the form of a film and dried at about 120° C. for about 1 hour to form a metal foam precursor. At this time, the coated metal foam precursor had a thickness of about 90 μm or so. The precursor was subjected to sintering by applying an external heat source in an electric furnace so as to be maintained in a hydrogen/argon gas atmosphere at a temperature of about 1000° C. for 2 hours and a copper foam having a thickness of about 25 μm or so was produced. The maximum pore size of the prepared sheet-shaped copper foam was in a level of less than approximately 25 μm.

Production of Metal Foam of Second Region

Alloy (Fe/Ni=1/4, weight ratio) powder of iron and nickel was applied to produce a metal foam of a second region. The average particle diameter (D50) of the alloy powder was approximately 7 μm or so. The alloy powder and polyvinyl acetate were mixed in a weight ratio of 3:2 (alloy powder: polyvinyl acetate) to form a slurry. The slurry was coated in the form of a film and dried at about 1,000° C. for about 1 hour to form a metal foam precursor. At this time, the coated metal foam precursor had a thickness of about 200 μm or so. The precursor was subjected to sintering by applying an external heat source in an electric furnace so as to be maintained in a hydrogen/argon gas atmosphere at a temperature of about 1000° C. for 2 hours and a metal foam having a thickness of about 80 μm or so was produced. The maximum pore size of the prepared sheet-shaped copper foam was in a level of less than approximately 10 μm.

Production of Composite Material

The produced copper metal foam and the alloy metal foam of iron and nickel were laminated with a general adhesive film to produce a composite material.

The shielding efficiency of the composite material was above approximately 90 dB in the range of 50 kHz to 3 GHz and the magnetic permeability was above approximately 100 at 50 kHz to 300 kHz. The shielding efficiency was measured according to the standard of ASTM D4935, and the magnetic permeability was measured according to a known relative magnetic permeability measurement method.

Example 2

A metal foam was produced in the same manner as in Example 1, except that the final metal foam had a thickness of 70 μm or so when the copper metal foam of the first region was produced (maximum pore size of less than 25 μm). In addition, a metal foam was produced in the same manner as in Example 1, except that ethyl cellulose was used instead of polyvinyl acetate and the final metal foam had a thickness of 95 μm or so when the metal foam of the second region was produced (maximum pore size in a level of 10 μm). The metal foams of the first and second regions were attached in the same manner as in Example 1 to produce a composite material. The shielding efficiency of the composite material was above approximately 90 dB in the range of 50 kHz to 3 GHz and the magnetic permeability was above approximately 100 at 50 kHz to 300 kHz.

Example 3

A metal foam was produced in the same manner as in Example 1, except that the thickness of the final metal foam was changed to about 100 μm or so when the copper metal foam of the first region was produced (maximum pore size of less than 15 μm). In addition, a metal foam was produced in the same manner as in Example 1, except that the thickness was changed to 40 μm or so when the metal foam of the second region was produced (maximum pore size in a level of 10 μm). The metal foams of the first and second regions were attached in the same manner as in Example 1 to produce a composite material. The shielding efficiency of the composite material was above approximately 90 dB in the range of 50 kHz to 3 GHz and the magnetic permeability was above approximately 100 at 50 kHz to 300 kHz.

Example 4

A metal foam was produced in the same manner as in Example 1, except that the thickness of the final metal foam was changed to 70 μm or so when the copper metal foam of the first region was produced (maximum pore size of less than 25 μm). In addition, a metal foam was produced in the same manner as in Example 1, except that 1/3 (Fe/Ni weight ratio) alloy powder (average particle diameter (D50 particle diameter): 9 μm)) of iron and nickel was applied as the metal alloy powder and the thickness of the final metal foam was changed to 40 μm or so when the metal foam of the second region was produced (maximum pore size in a level of 10 μm). The metal foams of the first and second regions were attached in the same manner as in Example 1 to produce a composite material. The shielding efficiency of the composite material was above approximately 90 dB in the range of 50 kHz to 3 GHz and the magnetic permeability was above approximately 100 at 50 kHz to 300 kHz.

Example 5

A metal foam was prepared in the same manner as in Example 1, except that the thickness of the final metal foam was changed to 70 μm or so when the copper metal foam of the first region was produced (maximum pore size of less than 25 μm). In addition, a metal foam was produced in the same manner as in Example 1, except that 1/4 (Fe/Ni, weight ratio) alloy powder (average particle diameter (D50 particle diameter): 7 μm)) of iron and nickel was applied as the metal alloy powder and the thickness of the final metal foam was changed to 100 μm or so when the metal foam of the second region was produced (maximum pore size in a level of 10 μm). The metal foams of the first and second regions were attached in the same manner as in Example 1 to produce a composite material. The shielding efficiency of the composite material was above approximately 90 dB in the range of 50 kHz to 3 GHz and the magnetic permeability was above approximately 100 at 50 kHz to 300 kHz.

Example 6

A metal foam was produced in the same manner, except that aluminum powder with a similar average particle diameter was applied instead of the copper powder and the thickness of the final metal foam was changed to 70 μm or so when the metal foam of the first region was produced (maximum pore size of less than 10 μm). In addition, a metal foam was produced in the same manner as in Example 1, except that the thickness of the final metal foam was changed to 40 μm or so when the metal foam of the second region was produced (maximum pore size in a level of 10 μm). The metal foams of the first and second regions were attached in the same manner as in Example 1 to produce a composite material. The shielding efficiency of the composite material was above approximately 90 dB in the range of 50 kHz to 3 GHz and the magnetic permeability was above approximately 100 at 50 kHz to 300 kHz.

Example 7

A composite material was produced by applying a pressure-sensitive adhesive layer as a conductive material-containing layer. The conductive pressure-sensitive adhesive was prepared by introducing CNT (carbon nanotube) powder (DP50~10 μm) as the conductive material to a general acrylic pressure-sensitive adhesive. The conductive pressure-sensitive adhesive was prepared by blending approximately 100 parts by weight of the conductive material relative to 100 parts by weight of the acrylic resin as the base resin of the pressure-sensitive adhesive. When the conductive pressure-sensitive adhesive layer was formed between two release films and then applied to the composite material, it was applied by peeling one release film of the release films off, applying the surface of the pressure-sensitive adhesive layer formed by the peeling to the surface of the desired composite material and then peeling the other release film off.

First, the copper metal foam in Example 1 above as the metal foam of the first region and the alloy metal foam of iron and nickel in Example 1 above as the metal foam of the second region were staggered in the form shown in FIG. 7 and then attached to each other with a general adhesive film to produce a composite material. Thereafter, as shown in FIG. 7, the conductive pressure-sensitive adhesive layer was applied to the surfaces of the metal foam layers (10, 20) of the first and second regions to produce a composite material. The shielding efficiency of the composite material was above approximately 90 dB in the range of 50 kHz to 3 GHz and the magnetic permeability was above approximately 100 at 50 kHz to 300 kHz.

Example 8

A composite material structure was formed in the same manner as in Example 7, except that the metal foam of Example 2 was used as the metal foam of the first region and the metal foam of Example 2 was applied as the metal foam of the second region. The shielding efficiency of the composite material was above approximately 90 dB in the range of 50 kHz to 3 GHz and the magnetic permeability was above approximately 100 at 50 kHz to 300 kHz.

Example 9

A composite material structure was formed in the same manner as in Example 7, except that the metal foam of Example 3 was used as the metal foam of the first region and the metal foam of Example 3 was applied as the metal foam of the second region. The shielding efficiency of the composite material was above approximately 90 dB in the range of 50 kHz to 3 GHz and the magnetic permeability was above approximately 100 at 50 kHz to 300 kHz.

Example 10

A composite material structure was formed in the same manner as in Example 7, except that the metal foam of Example 4 was used as the metal foam of the first region and the metal foam of Example 4 was applied as the metal foam of the second region. The shielding efficiency of the composite material was above approximately 90 dB in the range of 50 kHz to 3 GHz and the magnetic permeability was above approximately 100 at 50 kHz to 300 kHz.

Example 11

A composite material structure was formed in the same manner as in Example 7, except that the metal foam of Example 5 was used as the metal foam of the first region and the metal foam of Example 5 was applied as the metal foam of the second region. The shielding efficiency of the composite material was above approximately 90 dB in the range of 50 kHz to 3 GHz and the permeability was above approximately 100 at 50 kHz to 300 kHz.

Example 12

A composite material structure was formed in the same manner as in Example 7, except that the metal foam of Example 6 was used as the metal foam of the first region and the metal foam of Example 6 was applied as the metal foam of the second region. The shielding efficiency of the composite material was above approximately 90 dB in the range of 50 kHz to 3 GHz and the permeability was above approximately 100 at 50 kHz to 300 kHz.

What is claimed is:

1. A composite material, comprising:
    a first region formed of a first metal foam layer and
    a second region formed of a second metal foam layer,
    wherein the first metal foam layer has a conductive metal component,
    wherein the conductive metal component has a conductivity at 20° C. of 8 MS/m or more,
    wherein the second metal foam layer has a soft magnetic metal component, and
    wherein the metal foam layers of the first region and the second region are laminated on each other,
    said composite material further comprising a conductive material-containing layer, wherein the conductive material-containing layer is on the first or second metal foam layer,
    wherein the first metal foam layer and the second metal foam layer are laminated on each other in a staggered pattern such that a portion of a surface of the first metal foam layer facing the second metal foam layer does not overlap with a surface of the second metal foam layer facing the first metal foam layer, and/or a portion of the surface of the second metal foam layer facing the first metal foam layer does not overlap with the surface of the first metal foam layer facing the second metal foam layer, and
    the conductive material-containing layer is formed on the portion of the surface of the first metal foam layer facing the second metal foam layer which does not overlap with the surface of the second metal foam layer facing the first metal foam layer, or the portion of the surface of the second metal foam layer facing the first metal foam layer which does not overlap with the surface of the first metal foam layer facing the second metal foam layer.

2. The composite material according to claim 1, wherein the conductive metal component comprises one or more metals selected from the group consisting of nickel, iron, cobalt, silver, copper, gold, aluminum, calcium, tungsten, zinc, lithium, platinum, tin, lead, titanium, manganese, magnesium and chromium.

3. The composite material according to claim 1, wherein the soft magnetic metal component is an Fe and Ni alloy, an Fe, Ni and Mo alloy, an Fe, Al and Si alloy, an Fe, Si and B alloy, an Fe, Si and Nb alloy, an Fe, Si and Cu alloy or an Fe, Si, B, Nb and Cu alloy.

4. The composite material according to claim 1, wherein a total thickness of the first and second metal foam layers is in a range of 10 µm to 2 mm.

5. The composite material according to claim 4, wherein a ratio (T2/T1) of a thickness (T1) of the first metal foam layer and a thickness (T2) of the second metal foam layer is in a range of 0.2 to 10.

6. The composite material according to claim 1, further comprising a pressure-sensitive adhesive layer or an adhesive layer between the first and second metal foam layers.

7. The composite material according to claim 1, wherein the conductive material-containing layer comprises graphite, carbon black, carbon fiber, carbon nanotube, nickel, iron, cobalt, silver, copper, gold, aluminum, calcium, tungsten, zinc, lithium, platinum, tin, lead, titanium, manganese, magnesium or chromium.

8. The composite material according to claim 1, wherein the conductive material-containing layer is a pressure-sensitive adhesive layer or an adhesive layer.

9. The composite material according to claim 1, wherein the conductive material-containing layer comprises a resin selected from an acrylic resin, an epoxy resin, a silicone resin, and a urethane resin.

10. The composite material according to claim 9, wherein the conductive material-containing layer comprises a conductive material in a ratio of 30 to 200 parts by weight relative to 100 parts by weight of the resin.

11. A composite material structure comprising two or more composite materials according to claim 1, said composite materials joined at a conductive material-containing layer in the composite material.

* * * * *